(12) United States Patent
Wang et al.

(10) Patent No.: US 10,211,253 B1
(45) Date of Patent: Feb. 19, 2019

(54) SELF-ALIGNMENT OF A PAD AND GROUND IN AN IMAGE SENSOR

(71) Applicant: OmniVision Technologies, Inc., Santa Clara, CA (US)

(72) Inventors: Qin Wang, San Jose, CA (US); Gang Chen, San Jose, CA (US); Duli Mao, Sunnyvale, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 16 days.

(21) Appl. No.: 15/826,276

(22) Filed: Nov. 29, 2017

(51) Int. Cl.
*H01L 27/146* (2006.01)
*H01L 27/148* (2006.01)
*H01L 21/768* (2006.01)
*H01L 23/00* (2006.01)

(52) U.S. Cl.
CPC .. *H01L 27/14685* (2013.01); *H01L 21/76898* (2013.01); *H01L 24/05* (2013.01); *H01L 24/06* (2013.01); *H01L 27/14623* (2013.01); *H01L 27/14636* (2013.01); *H01L 27/14643* (2013.01); *H01L 27/14687* (2013.01); *H01L 27/14689* (2013.01); *H01L 27/14818* (2013.01); *H01L 2224/05007* (2013.01); *H01L 2224/05009* (2013.01); *H01L 2224/05026* (2013.01); *H01L 2224/05082* (2013.01); *H01L 2224/05093* (2013.01); *H01L 2224/05124* (2013.01); *H01L 2224/0603* (2013.01); *H01L 2924/04941* (2013.01)

(58) Field of Classification Search
CPC combination set(s) only.
See application file for complete search history.

(56) References Cited

U.S. PATENT DOCUMENTS

2017/0263659 A1* 9/2017 Lin .................. H01L 27/14643

OTHER PUBLICATIONS

Hernandez, J. et al., "Chemical Mechanical Polishing of Al and SiO2 Thin Films: The Role of Consumables", Journal of The Electrochemical Society, 1999, vol. 146, Issue 12, pp. 4647-4653, © The Electrochemical Society, Inc. doi: 10.1149/1.1392688.
U.S. Appl. No. 15/388,888, filed Dec. 22, 2016.

* cited by examiner

*Primary Examiner* — Thanhha S Pham
(74) *Attorney, Agent, or Firm* — Christensen O'Connor Johnson Kindness PLLC

(57) ABSTRACT

An image sensor includes a plurality of photodiodes disposed in a semiconductor material to convert image light into image charge, and a metal grid, including a metal shield that is coplanar with the metal grid, disposed proximate to a backside of the semiconductor material. The metal grid is optically aligned with the plurality of photodiodes to direct the image light into the plurality of photodiodes, and a contact pad is disposed in a trench in the semiconductor material. The contact pad is coupled to the metal shield to ground the metal shield.

10 Claims, 5 Drawing Sheets

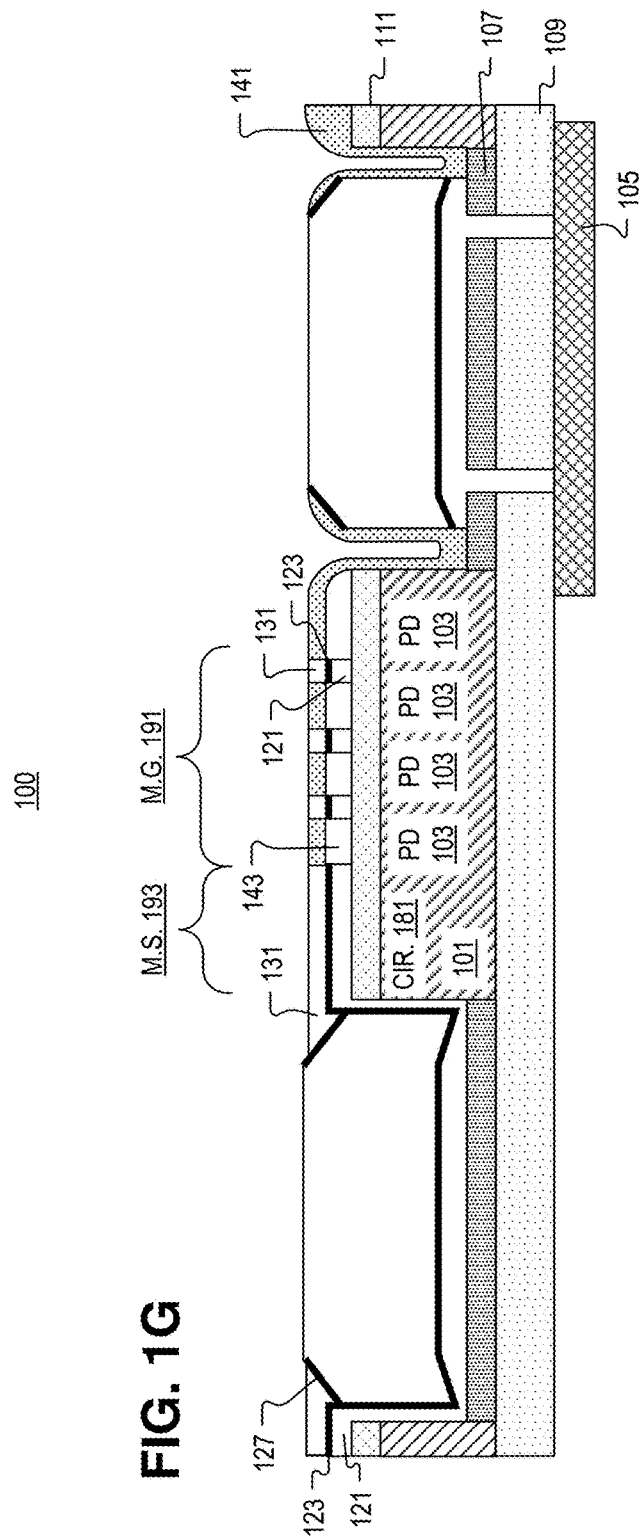

SELF-ALIGNMENT OF A PAD AND GROUND IN AN IMAGE SENSOR

TECHNICAL FIELD

This disclosure relates generally to semiconductor fabrication, and in particular but not exclusively, relates to CMOS image sensors.

BACKGROUND INFORMATION

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices.

The typical image sensor operates as follows. Image light from an external scene is incident on the image sensor. The image sensor includes a plurality of photosensitive elements such that each photosensitive element absorbs a portion of incident image light. Photosensitive elements included in the image sensor, such as photodiodes, each generate image charge upon absorption of the image light. The amount of image charge generated is proportional to the intensity of the image light. The generated image charge may be used to produce an image representing the external scene.

In general, image sensors may include a variety of electrical connections and contacts to power the image sensor, read out image data from the image sensor, or control the image sensor. Forming these contacts may be a cumbersome process and may take many additional fabrication steps.

BRIEF DESCRIPTION OF THE DRAWINGS

Non-limiting and non-exhaustive examples of the invention are described with reference to the following figures, wherein like reference numerals refer to like parts throughout the various views unless otherwise specified.

FIGS. 1A-1G illustrate a method of image sensor fabrication, in accordance with the teachings of the present disclosure.

Figure 1A:
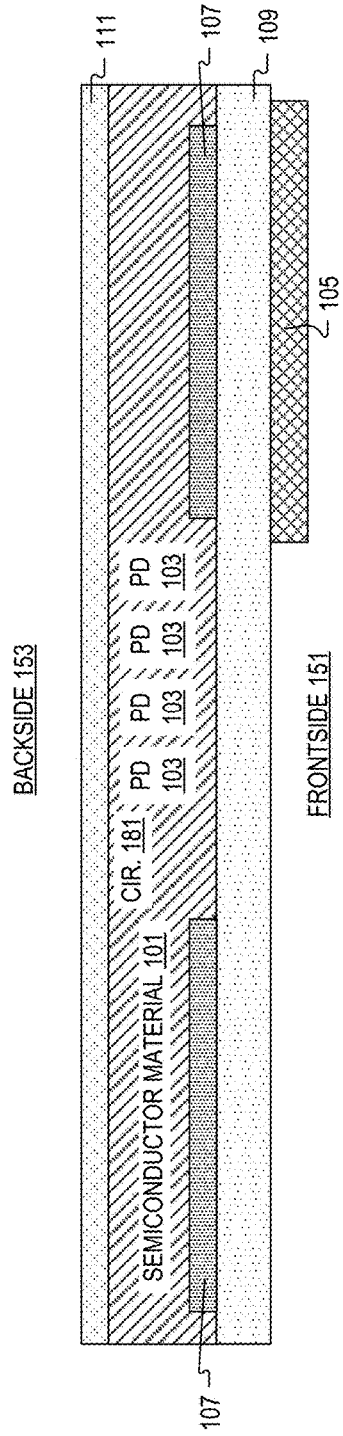

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method relating to self-alignment of a backside pad and ground in an image sensor are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Embodiments of this disclosure relate generally to simplifying the process flow needed to form metal contact pads for an image sensor. For backside illuminated (BSI) products, current processes require many photo lithography and etching steps to form a backside ground/contact pad, metal grid, and metal shield. The cost is high and cycle time is long. Moreover, the backside of the sensor may not be grounded because there is no connection from the metal shield to the contact pad.

Examples in accordance with the teachings of the present disclosure introduce self-aligned etching and chemical mechanical polishing (CMP) steps to achieve similar device architectures (e.g., a grounded backside, a metal grid, a metal shield, and an aluminum contact pad) with just three masking steps. Moreover, the backside ground can be implemented using a flat surface, which improves the outcome of later micro lens and color filter processes. As will be shown in the discussion of FIGS. 1A-1G, to achieve this self-aligned contact pad, the process may utilize step-height differences created by the pad opening, and a trench sidewall coated by an aluminum deposition.

FIGS. 1A-1G illustrate a method of image sensor fabrication, in accordance with the teachings of the present disclosure. One of ordinary skill in the art having the benefit of the present disclosure will understand that FIGS. 1A-1G may occur in any order and even in parallel. Further, figures may be added to, or removed from, the method, in accordance with the teachings of the present disclosure.

FIG. 1A shows providing semiconductor material 101 (e.g., silicon) including a plurality of photodiodes 103 disposed in semiconductor material 101, and positioned in an array. An oxide 111 (e.g., silicon oxide) is disposed on backside 153 of semiconductor material 101. Also included in semiconductor material 101 is control circuitry and readout circuitry 181, which is positioned proximate to the array. In one example, control circuitry and readout circuitry 181 is disposed on one, multiple, or all, sides of the photodiode 103 array. Photodiodes 103 are disposed proximate to the backside 153, which is opposite the frontside 151, of semiconductor material 101. Oxide material 109 is also disposed on frontside 151 of semiconductor material 101, and metal interconnect 105 is disposed on oxide material 109.

Also depicted are shallow trench isolation structures 107 disposed proximate to frontside 151. Shallow trench isolation structures 107 may be formed by etching trenches in the frontside 151 of semiconductor material 101 and backfilling the trenches with oxide, doped semiconductor, or the like. In the depicted example, metal interconnect 105 is slightly larger than shallow trench isolation structure 107, in a lateral direction. Moreover, in one example, metal interconnect 105 is only disposed proximate to some, but not all, of the shallow trench isolation structures 107 (e.g., second shallow trench isolation structure 107, shown on the right).

Figure 1B:
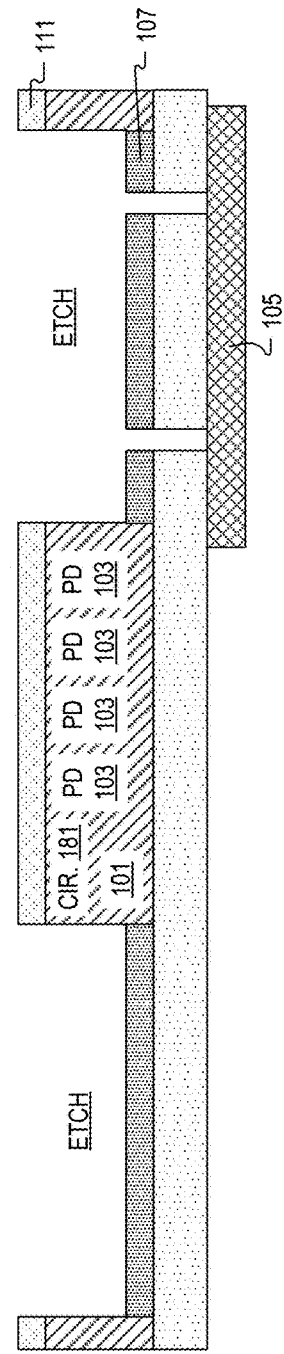

FIG. 1B illustrates two separate etch steps: etching into the semiconductor material 101 through oxide 111 from backside 153 to shallow trench isolation structures 107, and etching through shallow trench isolation structure 107 and oxide material 109 (e.g., $SiO_2$, $HfO_X$, or the like) to contact metal interconnect 105. As shown, there may be one or more contact plug holes etched through oxide material 109 to metal interconnect 105 (e.g., copper). In one example, the holes etched to metal interconnect 105 are created before the larger second trench (right) is etched. However, in other embodiments the smaller holes are etched after the larger second trench is etched. It is appreciate that while only two holes are depicted here, there may be any number of contact plug holes, in accordance with the teachings of the present disclosure.

Figure 1C:
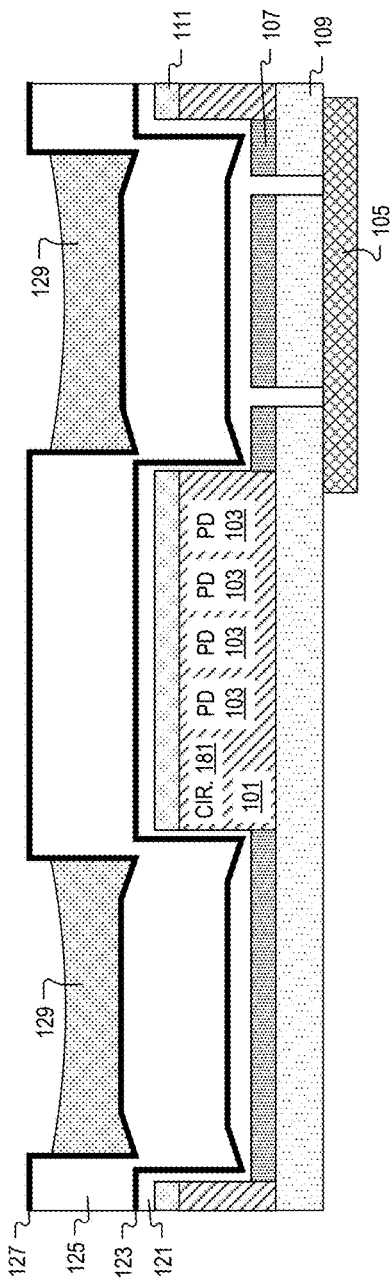

FIG. 1C depicts depositing contact pads in the trenches in the semiconductor material (both the first trench, left, and the second trench, right). This includes depositing first aluminum layer 121 (e.g., 2K angstroms in thickness) and second aluminum layer 125 (e.g., 25K angstroms in thickness). Disposed between first aluminum layer 121 and second aluminum layer 125 is first TiN layer 123. Disposed on second aluminum layer 125 is second TiN layer 127. Also depicted is hard mask oxide 129 being deposited in recesses in the aluminum layers 121 and 125. The recesses in the aluminum are formed above the trenches etched into semiconductor material 101. Thus, second aluminum layer 125 is disposed between first TiN layer 123 and second TiN layer 127, and second TiN layer 127 is disposed partially below hard mask oxide 129. As shown first aluminum layer 121 (a metal layer), extends from the contact pad along a sidewall of the trench in semiconductor material 101 to a portion of aluminum that will become a metal shield. First aluminum layer 121 is continuous from the contact pad to the portion of first aluminum layer 121 that will become the metal shield. It is appreciated that a chemical mechanical polishing step may be performed after the depositions, to remove excess oxide 129, and expose second TiN layer 127 (e.g., above photodiodes 103).

Also, the one or more contact plugs (made with the aluminum deposited in the second trench) extend through semiconductor material 101 and oxide material 109, and the one or more contact plugs contact metal interconnect 105 disposed on oxide material 109.

Figure 1D:
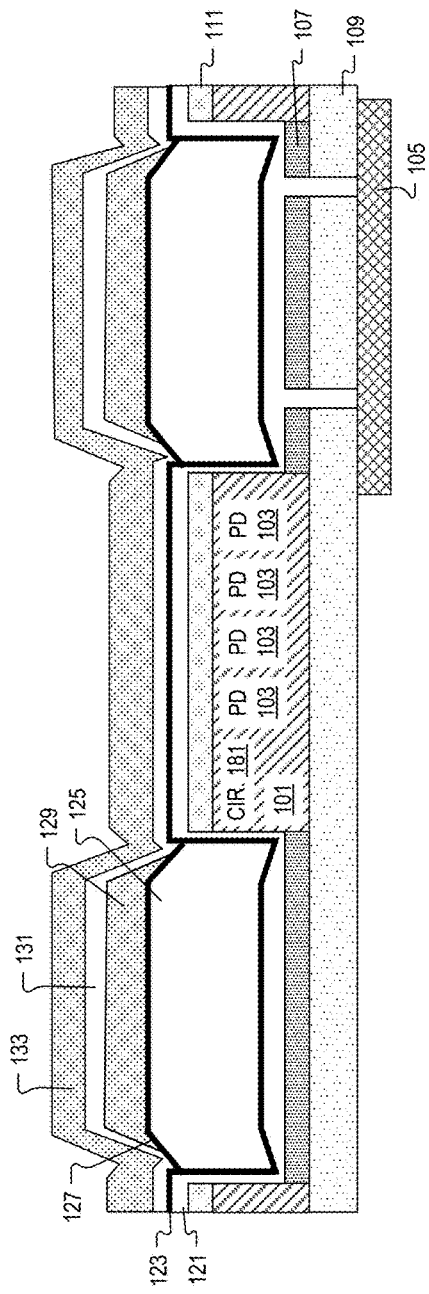

FIG. 1D shows etching away portions of the device architecture deposited in FIG. 1C. More specifically, part of second TiN layer 127 and part of second aluminum layer 125 are etched away leaving portions of hard mask oxide 129. The etch is stopped on first TiN layer 123.

In the depicted example, SiON layer 131 and a hard mask oxide layer 133 are deposited over the etched surface of second aluminum layer 125. As illustrated, on the surface of second TiN layer 127 (disposed above the trenches) is the first hard mask oxide layer 129, SiON layer 131, and second hard mask layer 133. As shown, SiON layer 131, and second hard mask layer 133 are continuous across the entire surface of semiconductor material 101.

Figure 1E:
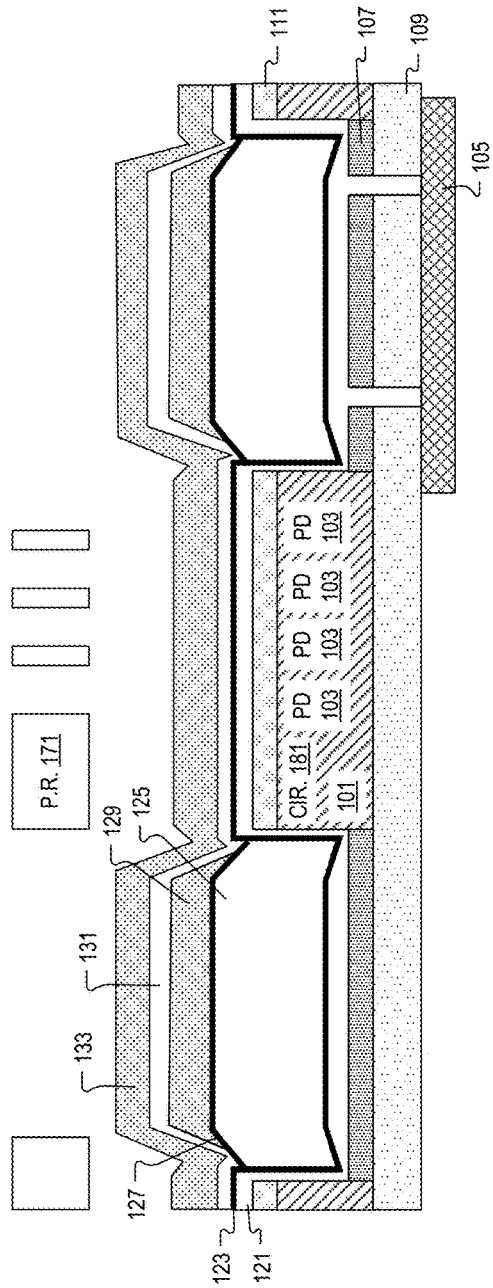
Figure 1F:
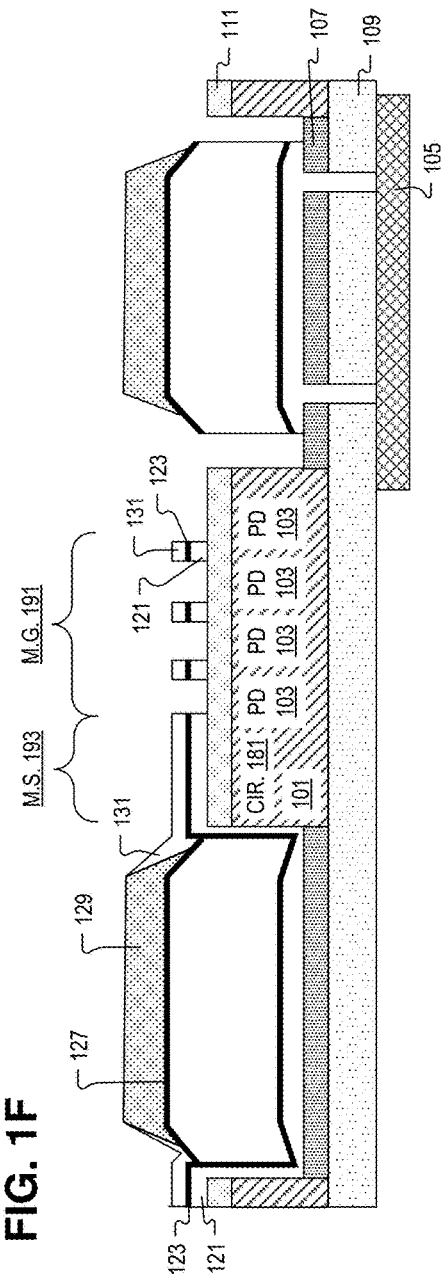

FIG. 1E illustrates depositing a photoresist layer 171 on the surface of wafer in order to etch way portions of the layer stack, and define features of the metal grid (e.g., metal grid 191 in FIG. 1F) and metal shield (e.g., metal shield 193 in FIG. 1F). In the depicted example, portions of the photoresist layer 171 have already been removed to define where the etch will occur. In some examples, photoresist layer 171 may be a negative resist or a positive resist. Moreover, any of the etching steps depicted herein may be a dry etch or a wet etch in accordance with the teachings of the present disclosure.

FIG. 1F depicts etching the portions defined by photoresist layer 171 to form the metal grid 191 and metal shield 193. This includes etching away at least part of hard mask oxide 133, SiON layer 131, and first TiN layer 123 to form metal grid 191. Metal grid 191 and metal shield 193 include SiON layer 131, first TiN 123 (disposed between semiconductor material 101 and SiON layer 131), and first aluminum layer 121 (disposed between TiN layer 123 and semiconductor material 101). As shown, metal shield 193 is substantially coplanar with the metal grid 191 (e.g., both in the same plane of device architecture).

In the depicted example, the etching step(s) remove portions of the second contact pad (right) and leave air gaps laterally disposed between both sides of the second contact pad and semiconductor material 101. It is appreciated that the first contact pad (left) is electrically coupled to metal shield 193 by virtue of the continuous first aluminum layer 121 that extends from the pad, up the sidewall of the trench and to metal shield 193.

FIG. 1G shows depositing oxide layers 141 and 143 (e.g., transparent oxide like $SiO_2$) to fill in gaps in metal grid 191. Also depicted is the CMP removal of residual oxide 141 and 143 from SiON layer 131 and second TiN layer 127. Then, second TiN layer 127 is removed from the top of the contact pads via etching. This exposes the aluminum contact pads. Thus, FIG. 1G depicts a nearly complete image sensor 100. It is appreciated that both the contact pads include the material layers disposed in the trenches.

In the illustrated example, plurality of photodiodes 103 is laterally disposed between the first trench (left) and the second trench (right). Moreover, metal grid 191 is optically aligned with photodiodes 103 so that light is reflected off of metal grid 191 and into photodiodes 103, thereby preventing optical cross talk. Also shown are air gaps on the sides of the second contact pad that have been partially filled with oxide 143.

As illustrated control circuitry and readout circuitry 181 is positioned on the periphery of the array of photodiodes 103. Metal shield 193 is disposed above control circuitry and readout circuitry 181 at least in part so that metal shield 193 is positioned to prevent image light from entering the control circuitry and the readout circuitry 181. In one example, control circuitry controls operation of the plurality of photodiodes, and the readout circuitry reads out image charge from the plurality of photodiodes 103. In some examples, metal shield 193 is electrically and/or physically coupled to metal grid 191.

In the depicted example, a color filter array and micro lens layer have not yet been formed and are omitted from the drawings in order to avoid obscuring certain aspects of the disclosure. However, in subsequent steps, a micro lens layer may be disposed above the metal grid so that the micro lenses focus light into the gaps in the metal grid and into the photodiodes. Moreover, a color filter array may be disposed between the micro lens layer and plurality of photodiodes 103. The color filter array may include blue, green, red, clear, and/or infrared filters and may be arranged in a Bayer pattern, EXR pattern, X-Trans pattern, or the like. The color filter array may be made out of dyed polymer. Similarly, the micro lenses may be formed on the color filter array by deposing blocks of polymer and then melting and reflowing the blocks to form the characteristic dome-like structure of micro lenses.

Figure 2:
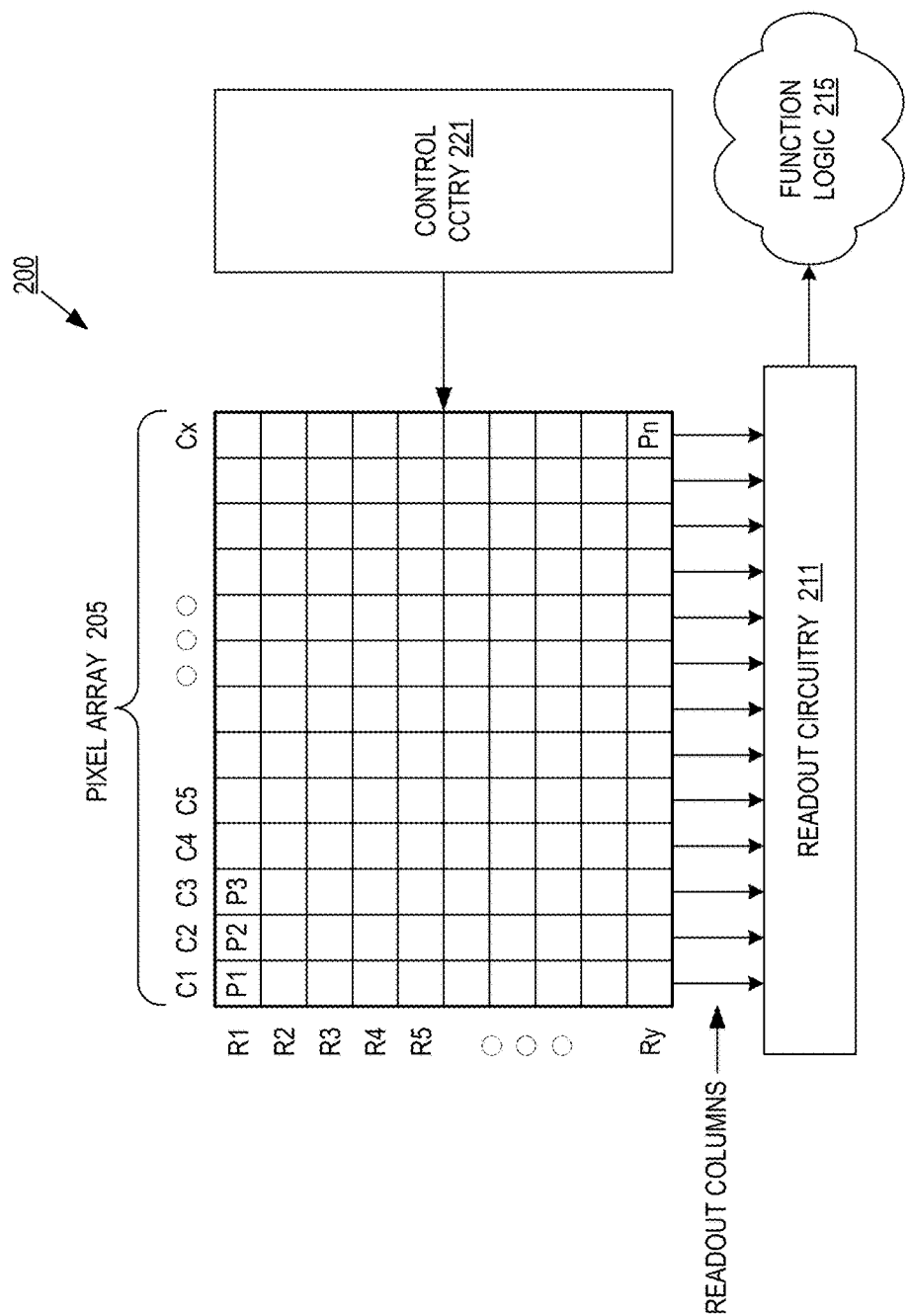
FIG. 2 illustrates a block diagram of one example of an imaging system which may include aspects of FIGS. 1A-1G, in accordance with the teachings of the present disclosure.

FIG. 2 illustrates a block diagram of one example of an imaging system 200 which may include aspects of FIGS. 1A-1G, in accordance with the teachings of the present disclosure. Imaging system 200 includes pixel array 205, control circuitry 221, readout circuitry 211, and function logic 215. In one example, pixel array 205 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array 205 has acquired its image data or image charge, the image data is readout by readout circuitry 211 and then transferred to function logic 215. In various examples, readout circuitry 211 may include amplification circuitry, analog-to-digital (ADC) conversion circuitry, or otherwise. Function logic 215 may simply store the image data or even manipulate the image data by applying post image effects (e.g., autofocus, crop, rotate, remove red eye, adjust brightness, adjust contrast, or otherwise). In one example, readout circuitry 211 may readout a row of image data at a time along readout column lines (illustrated) or may readout the image data using a variety of other techniques (not illustrated), such as a serial readout or a full parallel readout of all pixels simultaneously.

In one example, control circuitry 221 is coupled to pixel array 205 to control operation of the plurality of photodiodes in pixel array 205. For example, control circuitry 221 may generate a shutter signal for controlling image acquisition. In the depicted example, the shutter signal is a global shutter signal for simultaneously enabling all pixels within pixel array 205 to simultaneously capture their respective image data during a single acquisition window. In another example, image acquisition is synchronized with lighting effects such as a flash.

In one example, imaging system 200 may be included in a digital camera, cell phone, laptop computer, automobile or the like. Additionally, imaging system 200 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 200, extract image data from imaging system 200, or manipulate image data supplied by imaging system 200.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A method of image sensor fabrication, comprising:
providing a semiconductor material including:
a plurality of photodiodes disposed in the semiconductor material and positioned in an array; and
control circuitry and readout circuitry disposed in the semiconductor material and positioned proximate to the array;
etching a trench in the semiconductor material;
depositing a contact pad in the trench in the semiconductor material;
forming a metal grid, including a metal shield that is coplanar with the metal grid, disposed proximate to a backside of the semiconductor material, wherein the metal grid is optically aligned with the plurality of photodiodes to direct image light into the plurality of photodiodes; and
coupling the metal shield to the contact pad.

2. The method of claim 1, wherein coupling the metal shield to the contact pad includes depositing a metal layer that extends from the contact pad along a sidewall of the trench in the semiconductor material to the metal shield, wherein the metal layer is continuous from the contact pad to the metal shield.

3. The method of claim 2, wherein depositing a contact pad in the trench of the semiconductor material includes depositing aluminum and TiN in the trench.

4. The method of claim 3, further comprising depositing SiON and a hard mask oxide on the aluminum and the TiN.

5. The method of claim 4, wherein forming the metal grid includes depositing photoresist on the hard mask oxide, wherein the photoresist is used to define features of the metal grid and metal shield.

6. The method of claim 5, further comprising etching away at least part of the hard mask oxide, the SiON, and the TiN to form the metal grid, wherein the metal grid and the metal shield include the SiON, the TiN disposed between the semiconductor material and the SiON, and the aluminum disposed between the TiN and the semiconductor material.

7. The method of claim 1, further comprising:
etching a second trench into the semiconductor material; and
depositing a second contact pad disposed in the second trench, wherein the second contact pad includes:
one or more contact plugs that extend through the semiconductor material and an oxide material disposed proximate to a frontside, opposite the backside, of the semiconductor material, wherein the one or more contact plugs contact a metal interconnect disposed on the oxide material.

8. The method of claim 7, wherein the plurality of photodiodes is laterally disposed between the trench and the second trench.

9. The method of claim 7, wherein the one or more contact plugs include aluminum and the metal interconnect includes copper.

10. The method of claim 7, further comprising etching part of the second contact pad to form an air gap between the semiconductor material and the second contact pad.

* * * * *